United States Patent
Chiavetta

(10) Patent No.: US 7,502,265 B2
(45) Date of Patent: Mar. 10, 2009

(54) VOLTAGE REGULATOR HAVING A LOW NOISE DISCHARGE SWITCH FOR NON-VOLATILE MEMORIES, IN PARTICULAR FOR DISCHARGING WORD LINES FROM NEGATIVE VOLTAGES

(75) Inventor: Carmelo Chiavetta, Palermo (IT)

(73) Assignee: STMicroelectronics S.r.l, Agrate Brianza (MI) (IT)

( * ) Notice: Subject to any disclaimer, the term of this patent is extended or adjusted under 35 U.S.C. 154(b) by 158 days.

(21) Appl. No.: 11/734,974

(22) Filed: Apr. 13, 2007

(65) Prior Publication Data

US 2007/0242520 A1      Oct. 18, 2007

(30) Foreign Application Priority Data

Apr. 13, 2006   (IT) ........................... MI2006A0744

(51) Int. Cl.
*G11C 16/06*   (2006.01)
(52) U.S. Cl. ............................ 365/185.23; 365/185.25; 365/189.06
(58) Field of Classification Search ............ 365/185.23, 365/185.25, 180.06, 185.24, 204, 189.11
See application file for complete search history.

(56) References Cited

U.S. PATENT DOCUMENTS 6,738,292 B2 *   5/2004   Shioyama ............... 365/185.23

* cited by examiner

*Primary Examiner*—David Lam
(74) *Attorney, Agent, or Firm*—Lisa K. Jorgenson; Allen, Dyer, Doppelt, Milbrath & Gilchrist, P.A.

(57) ABSTRACT

A voltage regulator with a low noise discharge switch is used in non-volatile memory electronic devices, such as for discharging word lines from negative voltage potentials. The voltage regulator includes a first circuit portion with transistors for transforming a first voltage to a second voltage. The second voltage is applied to a second circuit portion with transistors. The output of the first circuit portion is coupled to ground by a discharge transistor. A third circuit portion with transistors receives a third voltage transformed, starting from the second voltage for biasing at least one word line connected downstream of the third circuit portion. A circuit portion with a discharge switch incorporates the discharge transistor, and further includes a pair of transistors connected in series to each other by an interconnection node. The interconnection node is connected to the body terminal of the discharge transistor.

25 Claims, 7 Drawing Sheets

VOLTAGE REGULATOR HAVING A LOW NOISE DISCHARGE SWITCH FOR NON-VOLATILE MEMORIES, IN PARTICULAR FOR DISCHARGING WORD LINES FROM NEGATIVE VOLTAGES

FIELD OF THE INVENTION

The present invention relates to a voltage regulator with a low noise discharge switch for use in non-volatile memory electronic devices, such as for discharging word lines from negative voltages.

BACKGROUND OF THE INVENTION

In non-volatile memories, such as with EEPROM Flash memories, it is necessary to carry out several operations to modify the state of the memory cells which alternatively apply positive and negative voltages to their gates. Memory cells are formed by MOS transistors interconnected in a matrix-like configuration. The columns or bit lines connect the drain terminals of the transistors, and the rows or word lines connect the gate terminals.

Since the gate terminals of the memory cells are connected to each other by the word lines of the matrix cells, these word lines should, each time, be discharged to ground for alternatively applying positive and negative voltages according to the type of modify, program or erase operations the cells are to undergo.

During the modify algorithm, and in particular during the erase, there are the steps of drain stress, erase verify and depletion verify in which it is necessary to discharge, each time, at least one word line whereon there is a potential of negative voltage, although all the other word lines are maintained at negative voltages.

At present, this discharge step may be by way of a simple NMOS transistor whose body terminal is connected to ground or to a negative voltage DECS, as shown in FIGS. 1 and 2. In greater detail, the example of FIG. 1 schematically shows the structure of a gate voltage regulator 1 for non-volatile memory cells incorporated in a matrix of cells of an electronic device of the known type.

The regulator 1 includes a first circuit portion 2 comprising a pair of transistors M1 and M2. The first transistor M1 is of the PMOS type, and the second transistor M2 is of the NMOS type. They are connected to each other by their respective drain and source terminals. That is, the source terminal S1 is connected to the drain terminal D2, while the drain terminal D1 is connected to the source S2.

These transistors M1 and M2 receive, on the respective terminals S1, D2, the potential VX_RAMP, while on the gate terminals the potentials TO_VX_RAMP_N and TO_VX_RAMP are respectively applied. On the body terminals of the transistors M1 and M2 the potentials WELL_PART and GND2 are respectively applied.

The other conduction terminals D1, S2 of the transistors M1, M2 are connected to ground by a discharge transistor M3 of the NMOS type which receives, on its own gate terminal, the signal TO_RAMP_N. This transistor M3 substantially forms a complementary pair with the transistor M1.

The output of the circuit portion 2 is represented by a connection line O2 which leads a voltage signal VXS_RAMP<0> towards a second circuit portion 3 of the regulator 1. This second circuit portion 3 comprises a pair of transistors M4 and M6. The first transistor M4 is of the PMOS type, and the second transistor M6 is of the NMOS type. They are connected to each other by their respective drain and source terminals. That is, the source terminal S4 is connected to the drain terminal D6, while the drain terminal D4 is connected to the source terminal S6. These transistors M4, M6 receive on the respective terminals S4, D6 the potential VX_RAMP<0>, while on the gate terminals the potentials SPSEL_N<0> and SPSEL<0> are respectively applied.

The output of the circuit portion 3 is represented by a connection line O3 which leads a voltage signal SP<0> towards a third circuit portion 4 of the regulator 1. A transistor M5 is connected to the transistor M4 and forms with it a complementary pair. The gate terminals of the transistors M4 and M5 receive the signal SPSEL_N<0>, while on the source terminal S5 of M5 a potential DECS is applied.

An inverter 5 formed by a complementary pair of transistors M7 and M8 receives on its own gate terminals the signal SPSEL_N<0>, and outputs the signal SPSEL<0> for the gate of M6. The regulator 1 is coupled to the word line $WL_{<0>}$ by the third circuit portion 4 which comprises the transistors M9, M10 and M11.

The transistor M9 is of the PMOS type while the other transistor M11 is of the NMOS type. These transistors are connected to each other by their respective drain and source terminals. That is, the source terminal S9 is connected to the drain terminal D11, and the drain terminal D9 is connected to the source terminal S11.

On the terminals S9 and D11 a potential $SP_{<0>}$ is applied which is produced by the circuit portion 3 of the regulator 1, arranged upstream with respect to the portion 4. A transistor M10 is connected to the transistor M9 and forms with it a complementary pair. The gate terminals of the transistors M9 and M10 receive the signal GP<0>, while on the source terminal S10 of M10 a potential DECS is applied.

FIG. 1 also shows the word line parasitic capacity. The prior art approach described with reference to FIG. 1 determines the presence of two drain-body PN junctions in the regions X and Y of the transistors M2 and M3 which are directly biased during all the discharge process of the word line starting from a negative potential voltage. Simulating a drain stress operative step, it is first necessary to pre-charge the Word Line $C_{WL}$ capacity. This word line parasitic capacity is normally identical to some hundreds of femtoFarad.

If a negative voltage of some volts is applied and the discharge to ground of the word line occurs through the transistor M3, two current peaks have been highlighted on the junctions X, source-body of the transistor M2 and Y drain-body of the transistor M3, due to the transit of the charge in the node VXS_RAMP<0> towards GND2. This represents a highly undesired effect which induces noise onto the virtual ground GND2 and affects the overall operation of the memory device as a whole.

A second known approach is shown in the example of FIG. 2 which completely corresponds to the circuit structure of FIG. 1, except for some transistors having different labels. The transistor M14, equivalent to M3 in the example of FIG. 1, has the body terminal whereon a potential DECS is applied.

This transistor is thus subjected to a body effect which, although eliminating the presence of PN junctions directly biased, does not allow a complete discharge of the word line from a negative voltage to ground. This is due to the presence of the body effect introduced by the biasing of the body terminal of the transistor M14.

SUMMARY OF THE INVENTION

In view of the foregoing background, an object of the present invention is to provide a different typology for a conduction path which allows for a discharge, quickly and completely to ground, with the negative potential voltage being on at least one word line of the matrix of memory cells, and without subjecting PN junctions to direct biasing, thus overcoming the limits and drawbacks of the prior art approaches.

This and other objects, advantages and features in accordance with the invention are provided by a circuit portion within a voltage regulator incorporating the discharge switch, and is structured so as to maintain a predetermined potential on the body terminal of the discharge switch. In this way, it is possible to avoid the presence of PN junctions directly biased during the discharge of the word lines from negative potentials. This avoids the presence of undesired current pulses responsible for the induction of noise on the virtual ground of the memory device.

On the basis of this approach, a voltage regulator for a non-volatile memory device comprising word lines to be discharged from negative voltages is provided. The voltage regulator comprises a first circuit portion comprising a pair of transistors for transforming a first voltage to a second voltage at an output thereof, and at least one discharge transistor coupled between the output and a voltage reference, and comprising a body terminal. A second circuit portion may comprises a pair of transistors for receiving the second voltage from the output of the first circuit portion. A third circuit portion may comprise a pair of transistors for receiving a third voltage transformed by the second voltage for biasing at least one word line connected downstream to the third circuit portion.

A fourth circuit portion may comprising a pair of transistors connected in series to each other with an interconnection node therebetween. The interconnection node may be coupled to the body terminal of the at least one discharge transistor. The fourth circuit portion may form with the at least one discharge transistor in the first circuit portion a discharge switch for discharging the at least one word line from negative voltages.

BRIEF DESCRIPTION OF THE DRAWINGS

The characteristics and the advantages of the voltage regulator according to the present invention will be apparent from the following description of an embodiment thereof given by way of non-limiting examples with reference to the annexed drawings.

DETAILED DESCRIPTION OF THE PREFERRED EMBODIMENTS

Figure 3:
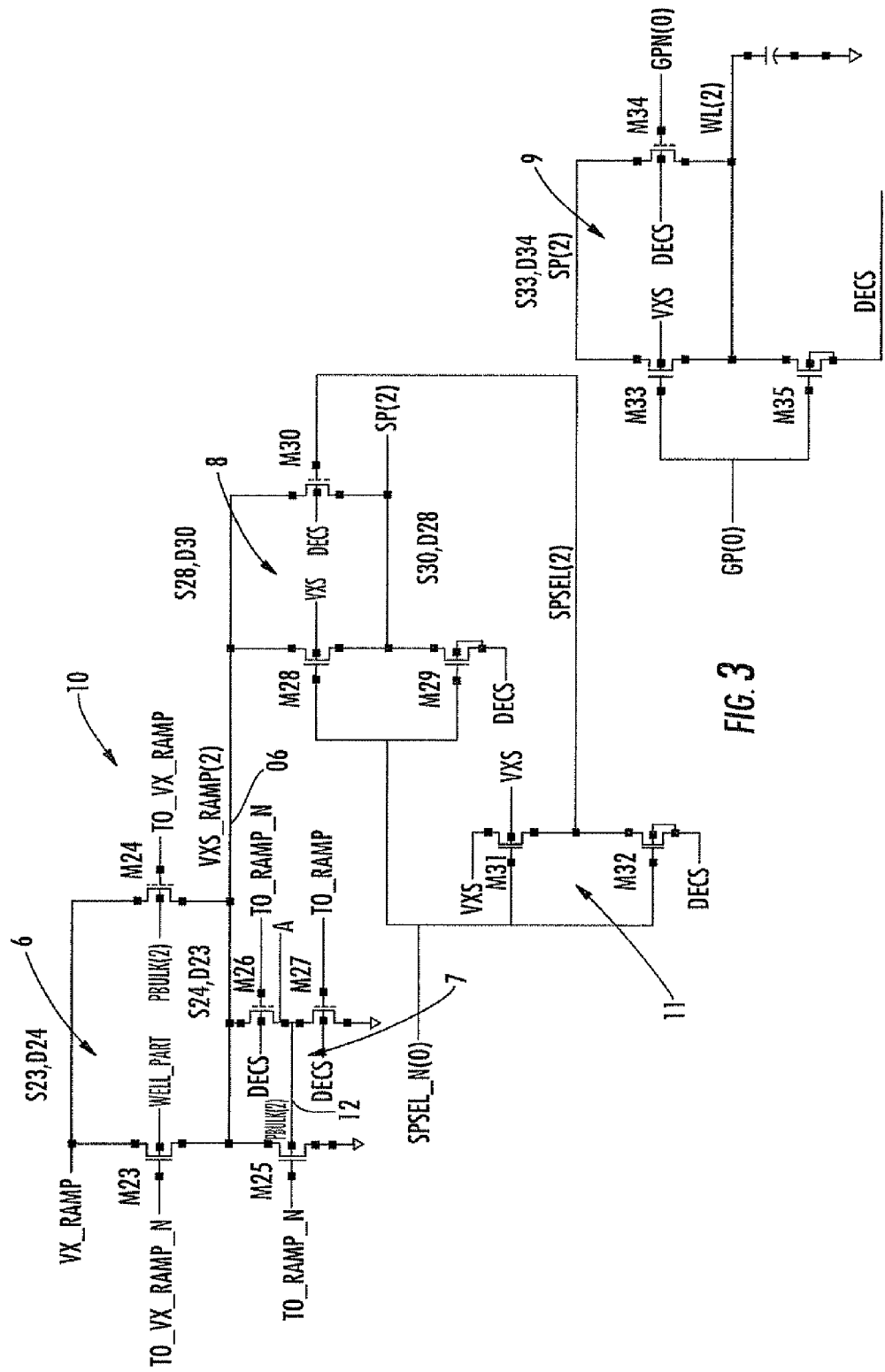
FIG. 3 shows a schematic view of a voltage regulator for non-volatile memory devices according to the present invention.

With reference to the example of FIG. 3, 10 indicates a voltage regulator with a low noise switch for use in non-volatile memory electronic devices, and in particular, for discharging, quickly and completely, word lines starting from negative voltages. As stated above, this need is tied to improving and making more efficient switching between different steps of the process for modifying the state of an electronic memory device, and in particular, a device formed as an integrated circuit.

FIG. 3 shows a voltage regulator 10 which has a structure similar to the regulator 1 of the prior art, except for the presence of a different circuit portion 7 which is in charge of the switch step for the discharge of at least one word line at a negative potential.

The regulator 10 includes a first circuit portion or stage 6 comprising a pair of transistors M23 and M24. The first transistor M23 is of the PMOS type, and the second transistor M24 is of the NMOS type. They are connected to each other by their respective drain and source terminals. That is, the source terminal S23 is connected to the drain terminal D24, while the drain terminal D23 is connected to the source terminal S24.

These transistors M23, M24 receive on the respective terminals S23, D24 the potential VX_RAMP, while on the gate terminals of the transistors M23, M24 the potentials TO_VX_RAMP_N and TO_VX_RAMP are respectively applied. On the body terminals of the transistors M23 and M24 the potentials WELL_PART and PBULK<2> are respectively applied.

The output of the circuit portion 6 is represented by a connection line O6 which leads a voltage signal VXS_RAMP<2> towards a second circuit portion or stage 8 of the regulator 10. The output O6 coincides with the terminals D23 and S24 of the transistors M23 and M24.

Advantageously, the conduction terminals D23, S24 of the transistors M23, M24 are also connected to ground through a circuit portion 7 comprising a particular low noise discharge switch. The portion 7 always contains a discharge transistor M25 of the NMOS type which receives, on its own gate terminal, the signal TO_RAMP_N. This transistor M25 substantially forms a complementary pair with the transistor M23.

A further pair of transistors M26, M27 connects the connection line O6 to ground. These transistors M26, M27 are both of the NMOS type and are connected in series to each other. The gate terminals of the transistors M26 and M27 receive respective control signals TO_RAMP_N and TO_RAMP. The body terminals of the transistors M26 and M27 are maintained at a DECS potential.

The interconnection node A between the transistors M26 and M27 is connected to the body terminal of the discharge transistor M25. This node is weakly driven to ground. On this body terminal of the transistor M25 there is the potential PBULK<2>.

The second circuit portion 8 comprises a pair of transistors M28 and M30. The first transistor M28 is of the PMOS type, and the second transistor M30 is of the NMOS type. They are connected to each other by their respective drain and source terminals. That is, the source terminal S28 is connected to the drain terminal D30, while the drain terminal D28 is connected to the source terminal S30.

These transistors MS8, M30 receive on the respective terminals S28, D30, the potential VX_RAMP<2>, while on the gate terminals the potentials SPSEL_N<0> and SPSEL<0> are respectively coupled. The output of the circuit portion 8 is shown by a connection line O7 which leads a voltage signal SP<2> towards a third circuit portion or output stage 9 of the regulator 10.

A transistor M29 is connected to the transistor M28 and forms with it a complementary pair. The gate terminals of the transistors M28 and M29 receive the signal SPSEL_N<0>, while on the source terminal S29 of M29, a potential DECS is applied. An inverter 11 formed by a complementary pair of transistors M31 and M32 receives on its own gate terminals the signal SPSEL_N<0> and outputs the signal SPSEL<0> for the gate of M30.

The regulator 10 is coupled to the word line $WL_{<2>}$ by means of the output stage 9 which comprises the transistors M33, M34 and M35. The transistor M33 is of the PMOS type, while the other transistor M34 is of the NMOS type. These transistors are connected to each other by their respective drain and source terminals. That is, the source terminal S33 is connected to the drain terminal D34, and the drain terminal D33 is connected to the source terminal S34. On the terminals S33 and D34 a potential $SP_{<2>}$ is applied, which is produced by the second circuit portion 8 of the regulator 10 arranged upstream with respect to the final stage 9.

A transistor M35 is connected to the transistor M33 and forms with it a complementary pair. The gate terminals of the transistors M33 and M35 receive the signal GP<0>, while on the source terminal S35 of M35 a potential DECS is applied.

Figure 4:
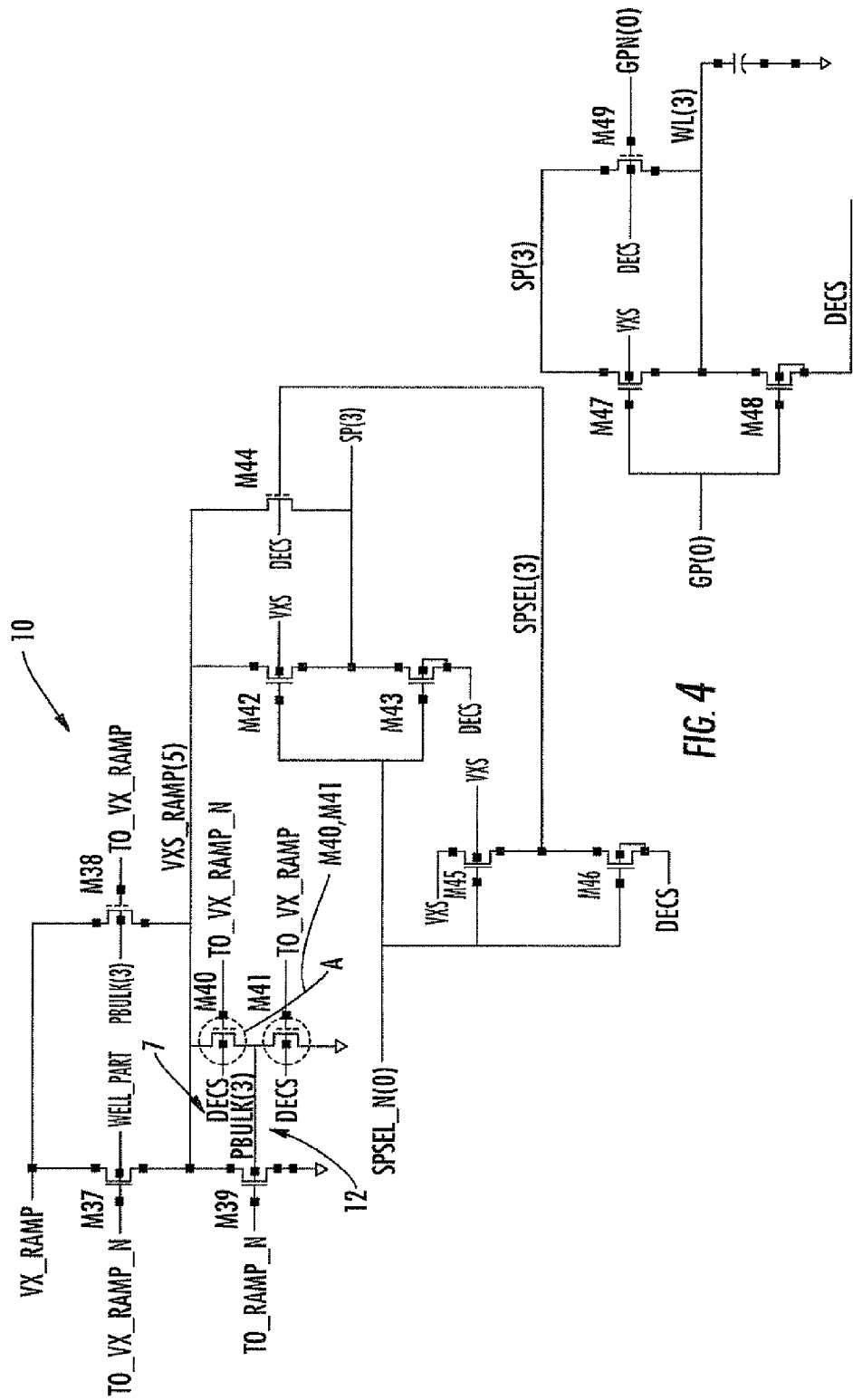
FIG. 4 shows a schematic view of a voltage regulator for non-volatile memory devices according to another embodiment of the present invention.

In a further embodiment of the regulator 10 according to the invention and as shown in FIG. 4, the discharge circuit portion 7 is enhanced by the particular biasing of the transistors M26 and M27. More particularly, these transistors are formed by transistors M40 and M41 of greater power, and the boosted potentials TO_VX_RAMP_N and TO_VX_RAMP are respectively applied to their gate terminals.

In this example the discharge transistor M25 is indicated as M38. In this way the node A is strongly fixed to ground, and the discharge occurs quickly and completely in the total absence of directly biased PN junctions.

Figure 5:
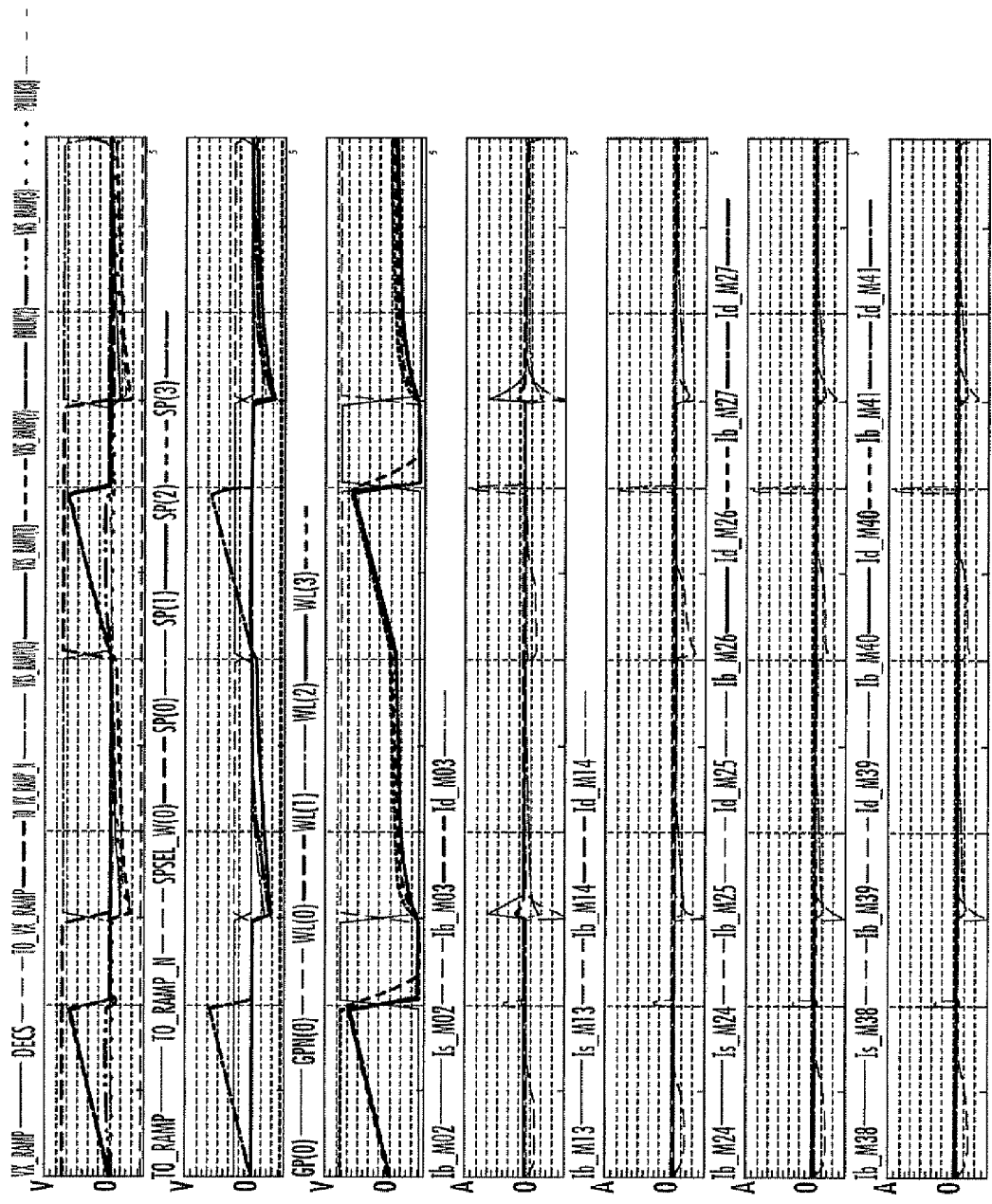
FIG. 5 shows a series of diagrams with a same time reference scale for different patterns as a function of the voltage and current signals of the regulator of FIG. 3 during discharge of the word line from negative voltages.

The timing pattern of the voltage and current signals in the main nodes and terminals of the regulator 10 is shown in FIG. 5 in a series of diagrams with a same timing base. These diagrams show the timing evolution, in voltage and current, of the word line during the discharge of the negative potentials.

Figure 1:
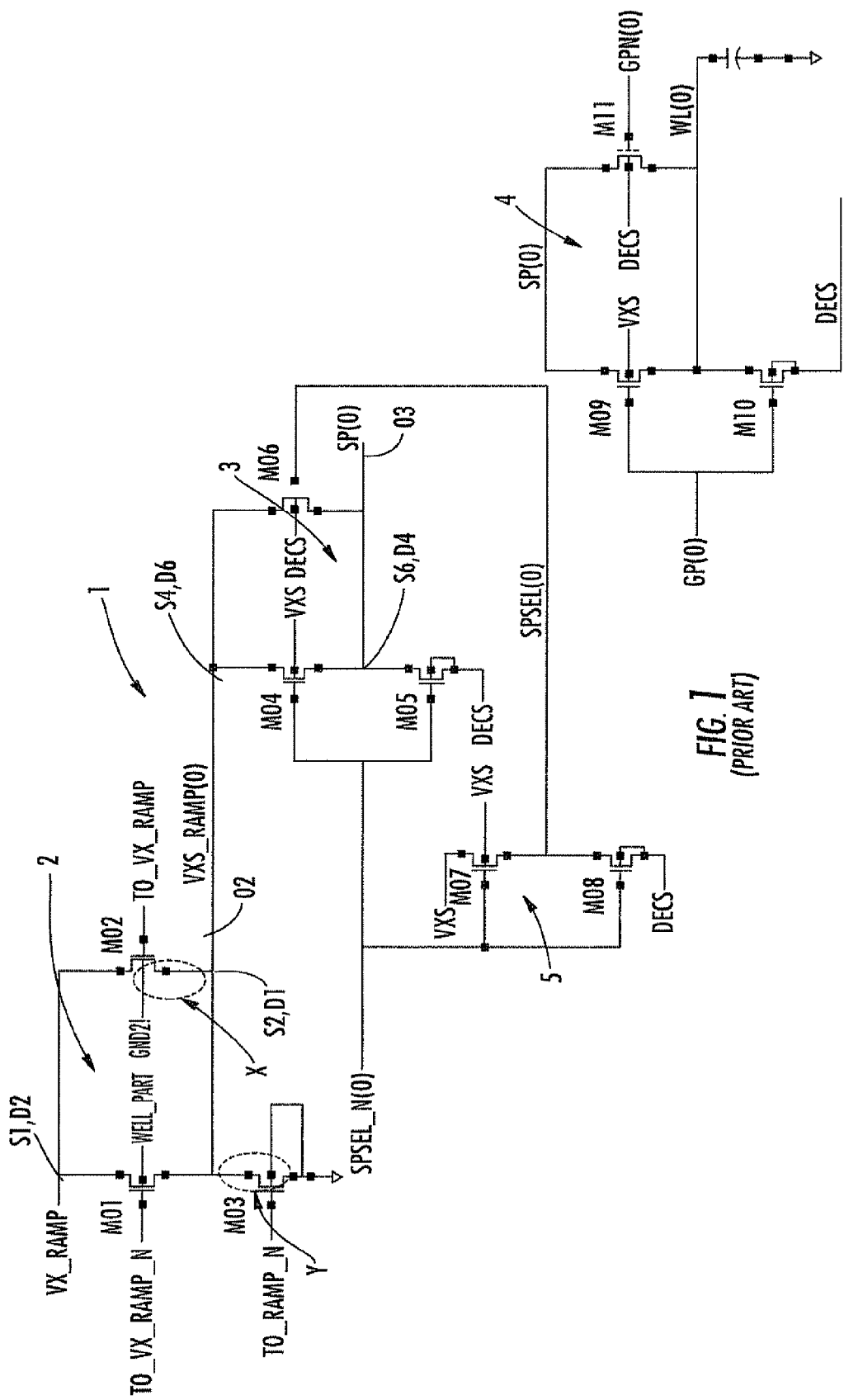
FIG. 1 shows a schematic view of a voltage regulator for non-volatile memory devices according to the prior art.
Figure 2:
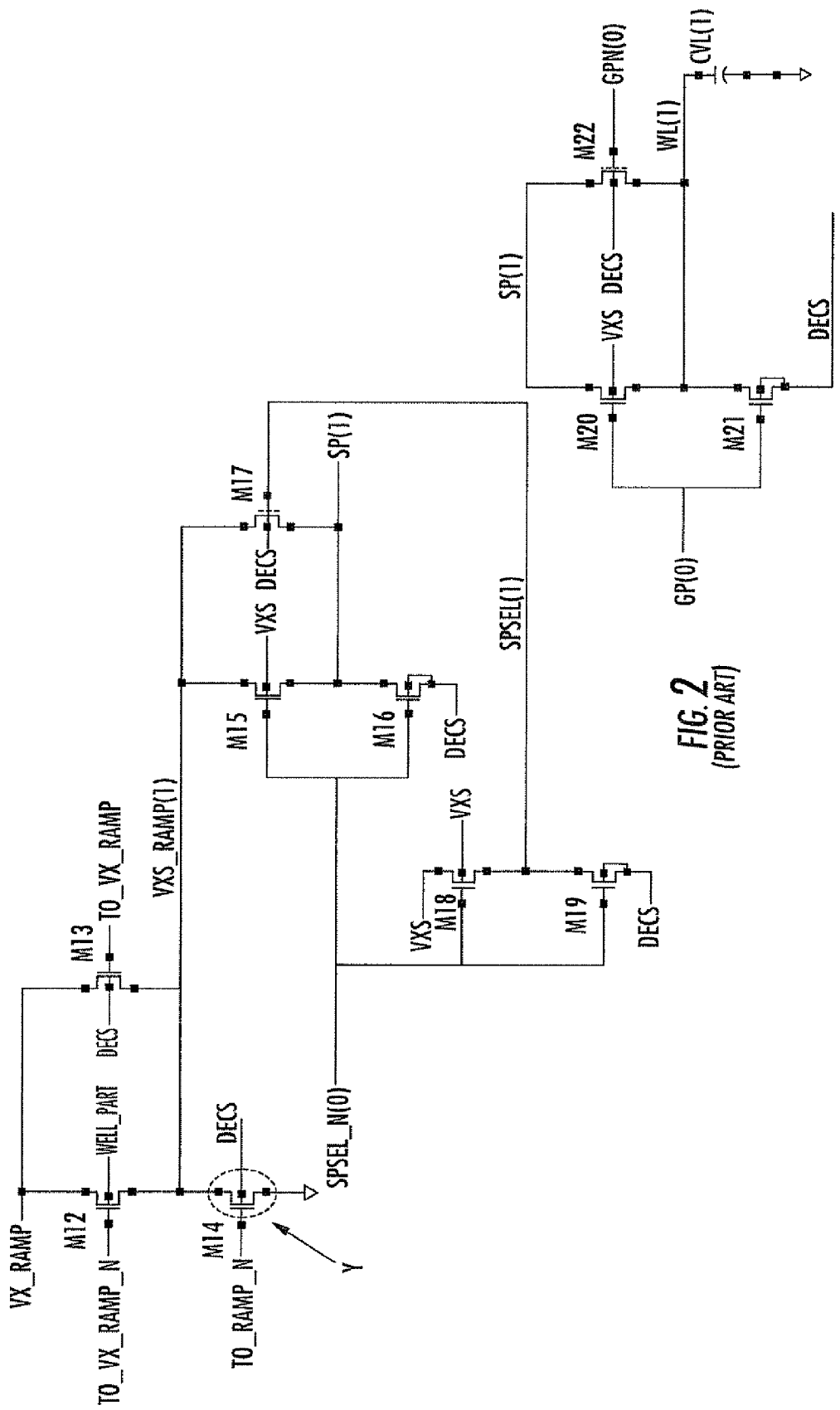
FIG. 2 shows a schematic view of a second type of voltage regulator for non-volatile memory devices according to the prior art.
Figure 6:
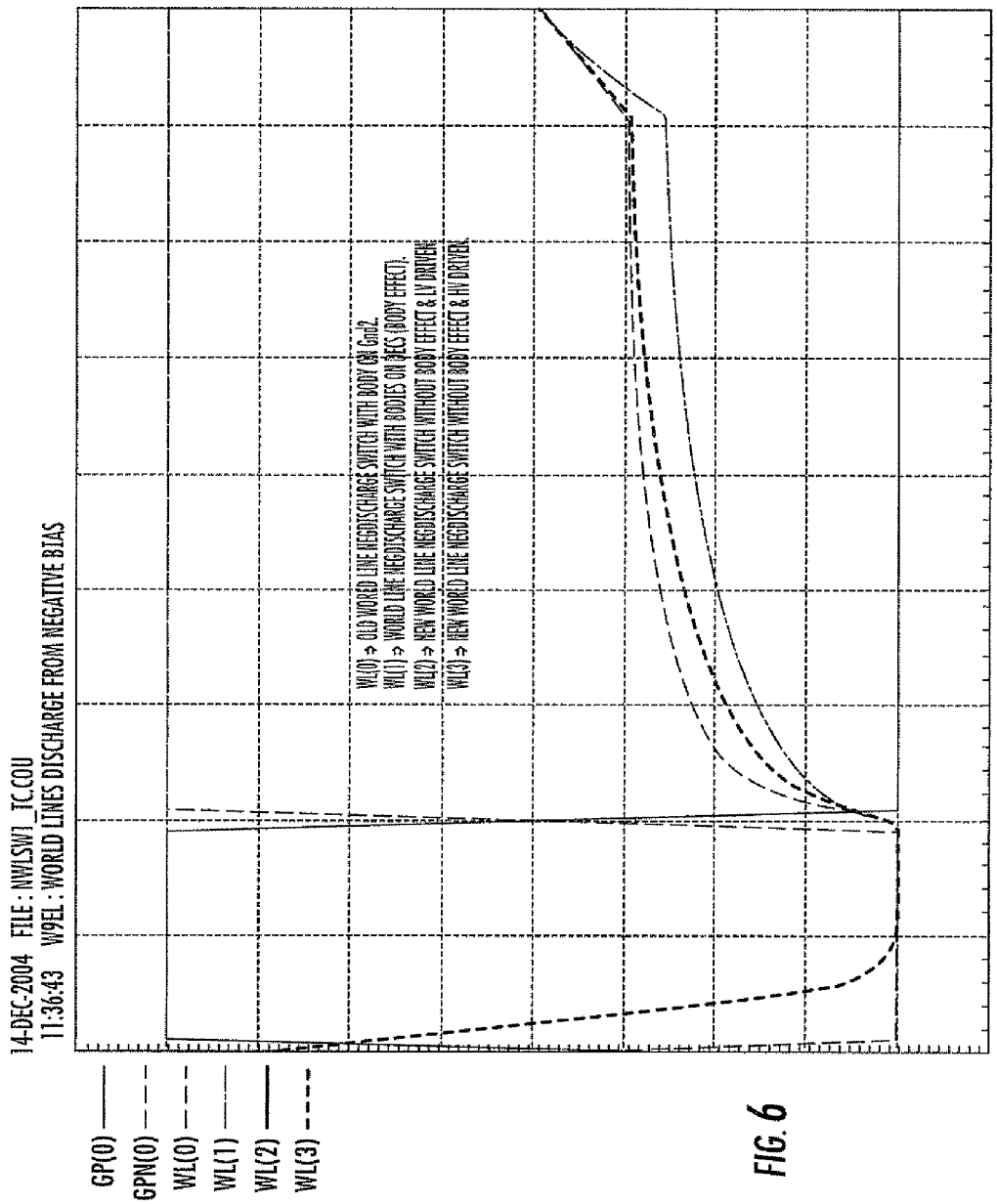
FIG. 6 shows a comparative diagram illustrating the pattern of the discharge of a word line for the examples of FIGS. 1 and 2 of the prior art, and for the examples of FIGS. 3 and 4 according to the present invention.

FIG. 6 shows, in a comparative diagram, the trend of the discharge of a word line for the examples of FIGS. 1 and 2 of the prior art, and for FIGS. 3 and 4 according to the invention.

Figure 7:
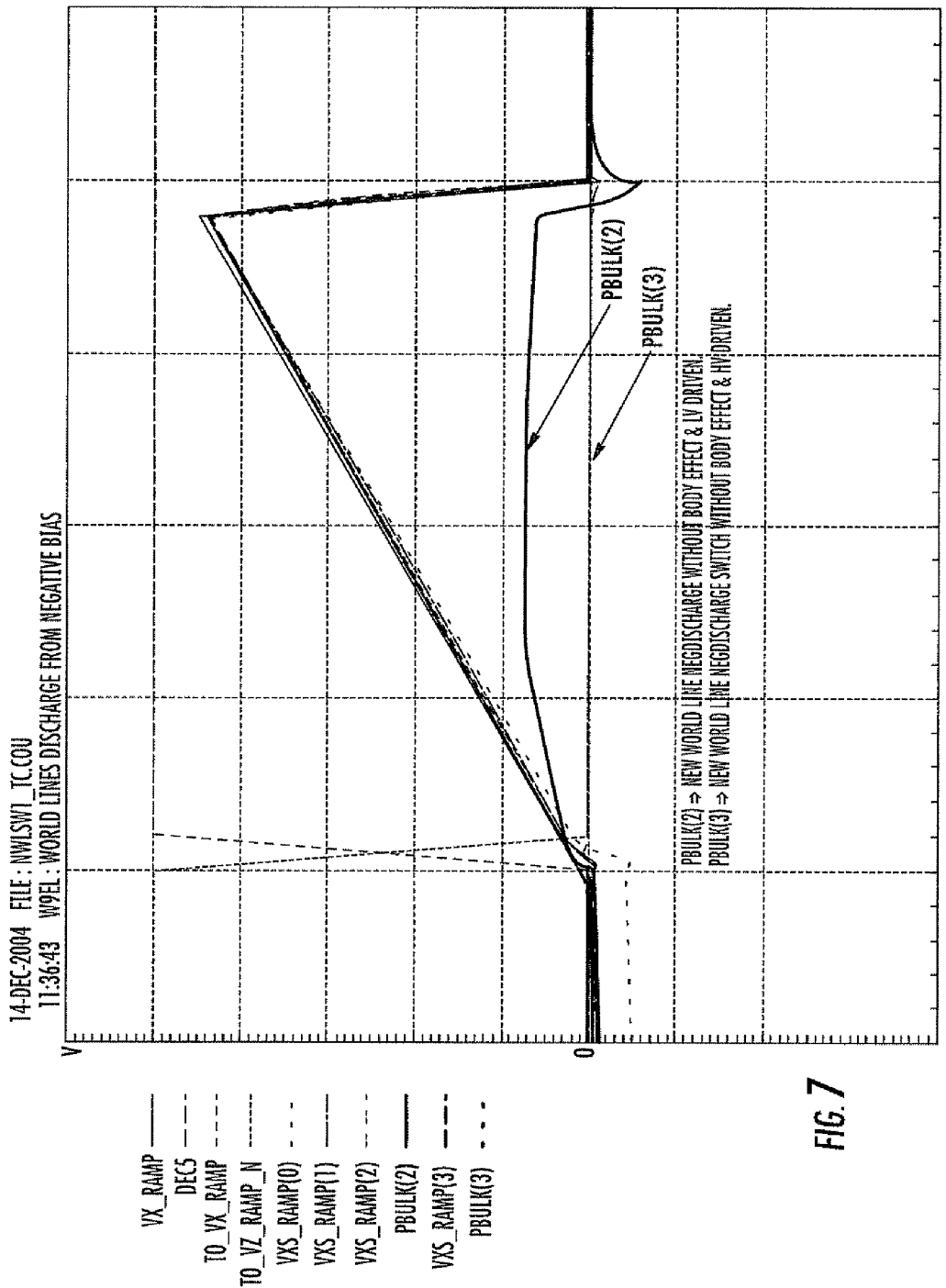
FIG. 7 shows a further comparative diagram illustrating the evolution of the potentials on the body terminals for the examples of FIGS. 3 and 4.

FIG. 7 shows a further comparative diagram on the evolution of the potentials on the body terminals and on the node A for the examples of FIGS. 3 and 4. The approach previously described addresses the technical problem and has several advantages, among which the following. It ensures the absence of directly biased PN junctions, thus avoiding the presence of undesired current pulses responsible for the introduction of noise on the virtual ground GND2.

It allows a complete discharge of the word lines to ground due to the elimination of the body effect on the transistors NMOS M25 or M39 only and exclusively during the discharge step of the word line by way of the transistor NMOS M26 or M40. This is while during the charge step of the word line, the body terminal PBULK<3> of the transistor M38 is maintained to ground by the transistor NMOS M41.

Another advantage is also in the need of driving both the NMOS power transistors M40 and M41 with the boosted voltages TO_VX_RAMP and TO_VX_RAMP_N already available on site, arises from the need of fixing the node PBULK<3> to ground during the charge of the word line. This does not occur when the similar NMOS M26 and M27 of the example of FIG. 3 are driven by non-boosted voltages TO_RAMP and TO_RAMP_N. They do not succeed in compensating the effect of the parasitic capacity CDB between drain and body of the NMOS M25 which induces an enhancement of the potential of the node A during the charge step of the relative Word Line, as shown in FIG. 7.

That which is claimed:

1. A voltage regulator for a non-volatile memory device comprising word lines to be discharged from negative voltages, the voltage regulator comprising:
    a first circuit portion comprising
        a pair of transistors for transforming a first voltage to a second voltage at an output thereof, and
        at least one discharge transistor coupled between the output and a voltage reference, and comprising a body terminal;
    a second circuit portion comprising a pair of transistors for receiving the second voltage from the output of said first circuit portion;
    a third circuit portion comprising a pair of transistors for receiving a third voltage transformed by the second voltage for biasing at least one word line connected downstream to said third circuit portion; and
    a fourth circuit portion comprising a pair of transistors connected in series to each other with an interconnection node therebetween, the interconnection node being coupled to said body terminal of said at least one discharge transistor, said fourth circuit portion forming with said at least one discharge transistor in said first circuit portion a discharge switch for discharging the at least one word line from negative voltages.

2. A voltage regulator according to claim 1, wherein said pair of transistors in said fourth circuit portion comprises NMOS transistors.

3. A voltage regulator according to claim 1, wherein each transistor in said pair of transistors in said fourth circuit portion comprises a gate terminal, and wherein said pair of gate terminals receive respective complementary voltages.

4. A voltage regulator according to claim 1, wherein said pair of transistors in said fourth circuit portion comprises power NMOS transistors.

5. A voltage regulator according to claim 4, wherein each transistor in said pair of power NMOS transistors comprises a gate terminal, and wherein said pair of gate terminals receive respective boosted voltages.

6. A voltage regulator according to claim 1, wherein each transistor in said pair of transistors in said fourth circuit portion comprises a body terminal, with said pair of body terminals being maintained at a same voltage.

7. A voltage regulator for a non-volatile memory device comprising word lines to be discharged from a bias voltage, the voltage regulator comprising:
    a first circuit portion comprising
        a pair of transistors for transforming a first voltage to a second voltage at an output thereof, and
        at least one discharge transistor coupled between the output and a voltage reference, and comprising a body terminal;
    a second circuit portion comprising a pair of transistors for receiving the second voltage from the output of said first circuit portion;
    a third circuit portion comprising a pair of transistors for receiving a third voltage transformed by the second voltage for biasing at least one word line connected downstream to said third circuit portion; and
    a fourth circuit portion comprising a pair of transistors connected in series to each other with an interconnection node therebetween, the interconnection node being coupled to said body terminal of said at least one discharge transistor, said fourth circuit portion forming with said at least one discharge transistor in said first circuit portion a discharge switch for discharging the at least one word line from the bias voltage.

8. A voltage regulator according to claim 7, wherein said pair of transistors in said fourth circuit portion comprises NMOS transistors.

9. A voltage regulator according to claim 7, wherein each transistor in said pair of transistors in said fourth circuit portion comprises a gate terminal, and wherein said pair of gate terminals receive respective complementary voltages.

10. A voltage regulator according to claim 7, wherein said pair of transistors in said fourth circuit portion comprises power NMOS transistors.

11. A voltage regulator according to claim 10, wherein each transistor in said pair of power NMOS transistors comprises a gate terminal, and wherein said pair of gate terminals receive respective boosted voltages.

12. A voltage regulator according to claim 7, wherein each transistor in said pair of transistors in said fourth circuit portion comprises a body terminal, with said pair of body terminals being maintained at a same voltage.

13. A memory device comprising:
    a plurality of memory cells;
    a plurality of word lines coupled to said plurality of matrix of memory cells; and
    a voltage regulator coupled to said plurality of word lines, and comprising
        a first circuit portion comprising
            a pair of transistors for transforming a first voltage to a second voltage at an output thereof, and
            at least one discharge transistor coupled between the output and a voltage reference, and comprising a body terminal;
        a second circuit portion comprising a pair of transistors for receiving the second voltage from the output of said first circuit portion,
        a third circuit portion comprising a pair of transistors for receiving a third voltage transformed by the second voltage for biasing at least one word line connected downstream to said third circuit portion, and
        a fourth circuit portion comprising a pair of transistors connected in series to each other with an interconnection node therebetween, the interconnection node being coupled to said body terminal of said at least one discharge transistor, said fourth circuit portion forming with said at least one discharge transistor in said first circuit portion a discharge switch for discharging at least one word line.

14. A memory device according to claim 13, wherein the at least one word line is discharged from a negative bias voltage by the discharge switch.

15. A memory device according to claim 13, wherein said pair of transistors in said fourth circuit portion comprises NMOS transistors.

16. A memory device according to claim 13, wherein each transistor in said pair of transistors in said fourth circuit portion comprises a gate terminal, and wherein said pair of gate terminals receive respective complementary voltages.

17. A memory device according to claim 13, wherein said pair of transistors in said fourth circuit portion comprises power NMOS transistors.

18. A memory device according to claim 17, wherein each transistor in said pair of power NMOS transistors comprises a gate terminal, and wherein said pair of gate terminals receive respective boosted voltages.

19. A memory device according to claim 13, wherein each transistor in said pair of transistors in said fourth circuit portion comprises a body terminal, with said pair of body terminals being maintained at a same voltage.

20. A method for discharging word lines from negative voltages in a non-volatile memory device using a voltage regulator, the memory device comprising word lines to be discharged from negative voltages, and the voltage regulator comprising first, second, third and fourth circuit portions, the method comprising:
    transforming a first voltage to a second voltage in the first circuit portion comprising a pair of transistors, and at least one discharge transistor coupled between an output of the pair of transistors and a voltage reference, with the at least one discharge transistor comprising a body terminal;
    receiving the second voltage at the second circuit portion comprising a pair of transistors from the output of the first circuit portion;
    receiving a third voltage at the third circuit portion comprising a pair of transistors, the third voltage being transformed by the second voltage for biasing at least one word line connected downstream to the third circuit portion; and
    discharging the at least one word line from negative voltages using a discharge switch formed by the at least one discharge transistor in the first circuit portion and the fourth circuit portion comprising a pair of transistors connected in series to each other with an interconnection node therebetween, with the interconnection node being coupled to the body terminal of the at least one discharge transistor.

21. A method according to claim 20, wherein the pair of transistors in the fourth circuit portion comprises NMOS transistors.

22. A method according to claim 20, wherein each transistor in the pair of transistors in the fourth circuit portion comprises a gate terminal, and wherein the pair of gate terminals receive respective complementary voltages.

23. A method according to claim 20, wherein the pair of transistors in the fourth circuit portion comprises power NMOS transistors.

24. A method according to claim 23, wherein each transistor in the pair of power NMOS transistors comprises a gate terminal, and wherein the pair of gate terminals receive respective boosted voltages.

25. A method according to claim 20, wherein each transistor in the pair of transistors in the fourth circuit portion comprises a body terminal, with the pair of body terminals being maintained at a same voltage.

* * * * *

UNITED STATES PATENT AND TRADEMARK OFFICE
CERTIFICATE OF CORRECTION

PATENT NO. : 7,502,265 B2  
APPLICATION NO. : 11/734974  
DATED : March 10, 2009  
INVENTOR(S) : Carmelo Chiavetta Page 1 of 1

It is certified that error appears in the above-identified patent and that said Letters Patent is hereby corrected as shown below:

Column 3, Line 24   Delete: "comprises a pair of transistors for receiving the second volt-"  
Insert: -- comprise a pair of transistors for receiving the second volt- --

Column 3, Line 30   Delete: "A fourth circuit portion may comprising a pair of transis-"  
Insert: -- A fourth circuit portion may comprise a pair of transis- --

Column 4, Line 65   Delete: "These transistors MS8, M30 receive on the respective ter-"  
Insert: -- These transistors M28, M30 receive on the respective ter- --

Column 6, Line 3    Delete: "pensating the effect of the parasitic capacity CDB between"  
Insert: -- pensating the effect of the parasitic capacity $C_{DB}$ between --

Signed and Sealed this

Eleventh Day of August, 2009

David J. Kappos  
*Director of the United States Patent and Trademark Office*